United States Patent
Kobayashi et al.

(10) Patent No.: US 9,624,374 B2
(45) Date of Patent: Apr. 18, 2017

(54) ADDITION-CURABLE SILICONE COMPOSITION AND OPTICAL DEVICE

(71) Applicant: SHIN-ETSU CHEMICAL CO., LTD., Tokyo (JP)

(72) Inventors: Yukito Kobayashi, Annaka (JP); Toshiyuki Ozai, Takasaki (JP); Mitsuhiro Iwata, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 144 days.

(21) Appl. No.: 14/612,342

(22) Filed: Feb. 3, 2015

(65) Prior Publication Data

US 2015/0252192 A1 Sep. 10, 2015

(30) Foreign Application Priority Data

Mar. 5, 2014 (JP) ................... 2014-042245

(51) Int. Cl.
| | |
|---|---|
| C08L 83/08 | (2006.01) |
| H01L 23/29 | (2006.01) |
| H01L 33/56 | (2010.01) |
| C08G 77/12 | (2006.01) |
| C08G 77/20 | (2006.01) |
| C08G 77/24 | (2006.01) |

(52) U.S. Cl.
CPC ............ *C08L 83/08* (2013.01); *H01L 23/296* (2013.01); *C08G 77/12* (2013.01); *C08G 77/20* (2013.01); *C08G 77/24* (2013.01); *C08L 2201/10* (2013.01); *C08L 2203/206* (2013.01); *C08L 2205/025* (2013.01); *H01L 33/56* (2013.01); *H01L 2924/0002* (2013.01); *Y10T 428/31663* (2015.04)

(58) Field of Classification Search
None
See application file for complete search history.

(56) References Cited

U.S. PATENT DOCUMENTS

| | | | | |
|---|---|---|---|---|
| 4,898,903 A * | 2/1990 | Rasch | ................... | C08K 5/0091 524/394 |
| 5,420,189 A * | 5/1995 | Kishita | ................... | C08L 83/08 524/731 |
| 5,665,794 A * | 9/1997 | Maxson | ................... | C08L 83/08 523/209 |
| 2004/0178509 A1 | 9/2004 | Yoshino et al. | | |
| 2005/0212008 A1 | 9/2005 | Miyoshi | | |
| 2006/0073347 A1 | 4/2006 | Morita et al. | | |
| 2006/0081864 A1 | 4/2006 | Nakazawa | | |
| 2007/0112147 A1 | 5/2007 | Morita et al. | | |
| 2009/0284149 A1 * | 11/2009 | Koshikawa | .......... | C08G 65/007 313/512 |
| 2010/0145000 A1 | 6/2010 | Kimura | | |
| 2014/0171599 A1 * | 6/2014 | Iwata | ................... | G02B 1/04 525/478 |
| 2015/0344671 A1 * | 12/2015 | Furukawa | ............... | C08L 83/08 310/366 |

FOREIGN PATENT DOCUMENTS

| | | |
|---|---|---|
| JP | 2004-143361 A | 5/2004 |
| JP | 2004-186168 A | 7/2004 |
| JP | 2004-292807 A | 10/2004 |
| JP | 2004-359756 A | 12/2004 |
| JP | 2005-076003 A | 3/2005 |
| JP | 2005-105217 A | 4/2005 |
| JP | 2005-307015 A | 11/2005 |
| JP | 2010-132795 A | 6/2010 |
| JP | 2013-010881 A | 1/2013 |
| WO | WO 2010/027105 | * 3/2010 |

* cited by examiner

*Primary Examiner* — Marc Zimmer
(74) *Attorney, Agent, or Firm* — Oliff PLC

(57) ABSTRACT

The present invention provides an addition-curable silicone composition comprising: (A) a linear organopolysiloxane having silicon atom-bonded aliphatic unsaturated groups and $CF_3—(CF_2)_y—(CH_2)_z—$ groups; (B) an organopolysiloxane having silicon atom-bonded aliphatic unsaturated groups and $CF_3—(CF_2)_y—(CH_2)_z—$ groups, and having a branched structure represented by $SiO_{4/2}$ and $RSiO_{3/2}$; (C) an organosilicon compound having silicon atom-bonded hydrogen atoms and represented by the following general formula (1); and (D) a platinum group metal-based catalyst. There can be provided an addition-curable silicone composition that provides a cured product having low refractive index, high transparency, excellent light extraction efficiency, good rubber properties and strength properties, and no tack after curing, and in particular, has good transmittance of light with a wavelength of 400 nm at 25° C.

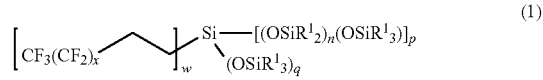

(1)

8 Claims, No Drawings

ADDITION-CURABLE SILICONE COMPOSITION AND OPTICAL DEVICE

BACKGROUND OF THE INVENTION

Field of the Invention

The present invention relates to an addition-curable silicone composition and an optical device. In particular, the present invention relates to an addition-curable silicone composition that provides a cured product having good rubber properties and strength properties, low refractive index, and excellent reliability of a product which is reduced in tack after curing, and an optical device that is encapsulated with a cured product of the composition.

Description of the Related Art

An addition-curable silicone composition includes an organopolysiloxane containing an aliphatic unsaturated group such as an alkenyl group and an organopolysiloxane containing a silicon atom-bonded hydrogen atom (SiH group) (organohydrogen polysiloxane), and is cured by a hydrosilylation reaction to give a cured product. Since such a cured product has excellent heat resistance, cold resistance, and electrical insulation and is transparent, the cured product is used for an encapsulant for various optical applications.

An addition-curable silicone composition used for optical applications and an encapsulant for optical devices formed from the composition require high transparency. In order to achieve high transparency, an organopolysiloxane having a dimethylsiloxane-diphenylsiloxane copolymer or polymethylphenylsiloxane as a main backbone is usually used as a substance having high refractive index.

However, the above-mentioned organopolysiloxane that provides a cured product having a refractive index of 1.54 or more is hard to be synthesized. A cured product of a branched organopolysiloxane in which a phenyl group is introduced may have a refractive index of about 1.53 to about 1.54, but is a hard resin and is not elastic. Further, a composition including a branched organopolysiloxane in combination with a linear organopolysiloxane has been proposed (Patent Documents 1 to 7), but the composition does not sufficiently satisfy transparency, refractive index, elasticity, and the like.

Patent Document 8 proposes an addition-curable silicone composition that provides a cured product having high transparency, high refractive index, and good strength properties, and an encapsulant for an optical device formed from the composition. However, the composition does not sufficiently satisfy the optical device performance to be provided, and in particular, the transmittance of light with a wavelength of 400 nm at 25° C. is poor.

PRIOR ART DOCUMENTS

Patent Documents

Patent Document 1: Japanese Patent Laid-Open Publication No. 2005-307015
Patent Document 2: Japanese Patent Laid-Open Publication No. 2004-143361
Patent Document 3: Japanese Patent Laid-Open Publication No. 2004-186168
Patent Document 4: Japanese Patent Laid-Open Publication No. 2004-292807
Patent Document 5: Japanese Patent Laid-Open Publication No. 2004-359756
Patent Document 6: Japanese Patent Laid-Open Publication No. 2005-076003
Patent Document 7: Japanese Patent Laid-Open Publication No. 2005-105217
Patent Document 8: Japanese Patent Laid-Open Publication No. 2010-132795
Patent Document 9: Japanese Patent Laid-Open Publication No. 2013-010881

SUMMARY OF THE INVENTION

The present inventors proposed an addition-curable silicone composition that provides a cured product having low refractive index due to contained fluorine, and good transparency, and an encapsulant for an optical device formed from the composition in Patent Document 9. However, as an organohydrogen polysiloxane used in the composition, an oligomer having comparatively low molecular weight is preferably used from the viewpoint of compatibility. In this case, the organohydrogen polysiloxane is volatilized during a process of producing a device, and tack remains after curing; and thus, high reliability cannot be achieved. Further, there is a problem in which depending on an organohydrogen polysiloxane to be used, the refractive index thereof increases and the transparency of an addition cured product having low refractive index remarkably decreases.

The present invention was made in view of the above situation, and has an object to provide an addition-curable silicone composition that provides a cured product having low refractive index, high transparency, excellent light extraction efficiency, good rubber properties and strength properties, and no tack after curing, and in particular, has good transmittance of light with a wavelength of 400 nm at 25° C.

In order to solve the problem as mentioned above, the present invention provides an addition-curable silicone composition comprising:

(A) a linear organopolysiloxane having two or more silicon atom-bonded aliphatic unsaturated groups and one or more silicon atom-bonded $CF_3—(CF_2)_y—(CH_2)_z—$ groups in one molecule ("y" represents an integer of 0 or more and "z" represents an integer of 1 or more), wherein the amount is 100 parts by mass;

(B) an organopolysiloxane having two or more silicon atom-bonded aliphatic unsaturated groups and one or more silicon atom-bonded $CF_3—(CF_2)_y—(CH_2)_z—$ groups in one molecule, and having either or both of siloxane units represented by $SiO_{4/2}$ and $RSiO_{3/2}$ as a branched structure ("y" represents an integer of 0 or more, "z" represents an integer of 1 or more, and R represents a substituted or unsubstituted monovalent hydrocarbon group), wherein the amount is 1 to 100 parts by mass;

(C) an organosilicon compound represented by the following general formula (1), wherein the amount is such an amount that the molar ratio of the SiH group in the component (C) to the total aliphatic unsaturated group in the components (A) and (B) satisfies $0.2 \leq$ SiH group/aliphatic unsaturated group $\leq 5.0$,

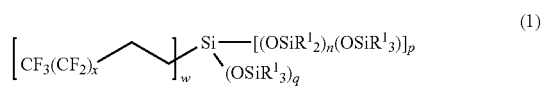

(1)

wherein $R^1$ represents a hydrogen atom or the same or different substituted or unsubstituted monovalent organic group having 1 to 10 carbon atoms, "x" represents an integer of 0 or more, "w", "p", and "q" satisfy 1≤w≤2, 0<p≤3, 0≤q<3, 2≤p+q≤3, and w+p+q=4, "n" represents an integer of 1 or more, and two or more of $R^1$s are hydrogen atoms; and (D) a platinum group metal-based catalyst, wherein the amount is an effective amount.

The addition-curable silicone composition of the present invention is an addition-curable silicone composition that provides a cured product having low refractive index, high transparency, excellent light extraction efficiency, good rubber properties and strength properties, and no tack after curing, and in particular, has good transmittance of light with a wavelength of 400 nm at 25° C.

In this case, it is preferable that the addition-curable silicone composition be one capable of providing a cured product having a transmittance of light with a wavelength of 300 to 800 nm at 25° C. of 80% or more in a 2 mm thick layer by curing.

An addition-curable silicone composition having such a transmittance of light can be particularly suitably used for optical applications.

In this case, it is preferable that the addition-curable silicone composition be one capable of providing a cured product having a refractive index (25° C.) with a visible light (589 nm) of 1.40 or less by curing.

When the refractive index of a cured product is 1.40 or less, the transmittance of light with a wavelength of 400 nm at 25° C. can be more excellent and the light extraction efficiency can be also excellent.

The present invention further provides an optical device encapsulated with a cured product of the above-mentioned addition-curable silicone composition.

The optical device of the present invention can be particularly excellent in reliability since it is encapsulated with the above-mentioned cured product of the addition-curable silicone composition of the present invention.

As described above, the cured product obtained by curing the addition-curable silicone composition of the present invention has high transparency, low refractive index, excellent light extraction efficiency, good rubber properties and strength properties, and no tack after curing, since components therein are not volatilized during a process of producing a device. Since the transmittance of light with a wavelength of 400 nm at 25° C. desired as the optical device performance is excellent, the composition can be particularly suitably used for an encapsulant for an optical device such as LED. Specifically, when the addition-curable silicone composition of the present invention is used as an encapsulant for an optical device, light emitted from the optical device is prevented from being totally reflected on a surface of the cured product having high transparency and low refractive index. Therefore, the brightness of LED can be particularly improved.

Furthermore, an optical device of the present invention that is encapsulated with the cured product of such an addition-curable silicone composition of the present invention can be particularly excellent in reliability.

DETAILED DESCRIPTION OF THE PREFERRED EMBODIMENTS

As described above, a conventional addition-curable silicone resin composition that is lowered in refractive index has a problem in which the reliability of a product has a serious defect, for example, an organohydrogen polysiloxane is volatilized during a process of producing a device to leave tack after curing. Further, the composition has a problem in which depending on an organohydrogen polysiloxane to be used, the compatibility thereof decreases and the refractive index thereof increases.

The present inventors have intensively studied to achieve the objects. As a result, the inventors have found that a composition that provides a cured product having excellent optical performance and high reliability can be obtained by using an organohydrogen polysiloxane having a fluorine-substituted hydrocarbon group(s) and a D unit(s).

Specifically, the inventors have found that when a linear organopolysiloxane and a branched organopolysiloxane are used in combination as an organopolysiloxane having a silicon atom-bonded aliphatic unsaturated group(s) and a silicon atom-bonded $CF_3$—$(CF_2)_y$—$(CH_2)_z$— group(s), and an organohydrogen polysiloxane represented by the following general formula (1),

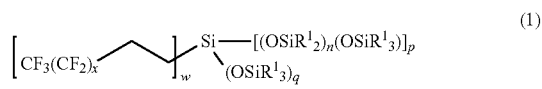 (1)

is used, a cured product of an addition-curable silicone composition can be lowered in refractive index, the transmittance of light with a wavelength of 300 to 800 nm at 25° C. is improved, and in particular, the transmittance of light with a wavelength of 400 nm at 25° C. is improved. In addition, the inventors have found that a cured product having high transparency, and good rubber properties and strength properties is obtained, and tack does not remain after curing since the organohydrogen polysiloxane is not volatilized at the time of curing. The present invention has been thus completed.

The present invention is an addition-curable silicone composition comprising:

(A) a linear organopolysiloxane having two or more silicon atom-bonded aliphatic unsaturated groups and one or more silicon atom-bonded $CF_3$—$(CF_2)_y$—$(CH_2)_z$— groups in one molecule ("y" represents an integer of 0 or more and "z" represents an integer of 1 or more), wherein the amount is 100 parts by mass;

(B) an organopolysiloxane having two or more silicon atom-bonded aliphatic unsaturated groups and one or more silicon atom-bonded $CF_3$—$(CF_2)_y$—$(CH_2)_z$— groups in one molecule, and having either or both of siloxane units represented by $SiO_{4/2}$ and $RSiO_{3/2}$ as a branched structure ("y" represents an integer of 0 or more, "z" represents an integer of 1 or more, and R represents a substituted or unsubstituted monovalent hydrocarbon group), wherein the amount is 1 to 100 parts by mass;

(C) an organosilicon compound represented by the following general formula (1), wherein the amount is such an amount that the molar ratio of the SiH group in the component (C) to the total aliphatic unsaturated group in the components (A) and (B) satisfies 0.2≤SiH group/aliphatic unsaturated group≤5.0,

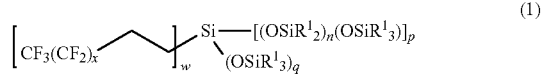 (1)

wherein $R^1$ represents a hydrogen atom or the same or different substituted or unsubstituted monovalent organic group having 1 to 10 carbon atoms, "x" represents an integer of 0 or more, "w", "p", and "q" satisfy 1≤w≤2, 0<p≤3, 0≤q<3, 2≤p+q≤3, and w+p+q=4, "n" represents an integer of 1 or more, and two or more of $R^1$s are hydrogen atoms; and (D) a platinum group metal-based catalyst, wherein the amount is an effective amount.

Hereinafter, the present invention will be described in detail, but the present invention is not limited to these.

<Component (A)>

The component (A) is a linear organopolysiloxane having two or more silicon atom-bonded aliphatic unsaturated groups and one or more silicon atom-bonded $CF_3$—$(CF_2)_y$—$(CH_2)_z$— groups in one molecule, wherein "y" represents an integer of 0 or more and "z" represents an integer of 1 or more, and is a base polymer.

It is preferable that the component (A) be an organopolysiloxane represented by the following general formula (2),

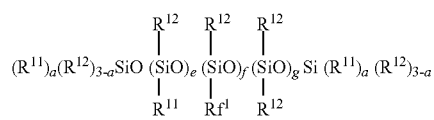

wherein $R^{11}$ represents an aliphatic unsaturated group, $R^{12}$ represents the same or different substituted or unsubstituted monovalent hydrocarbon group having 1 to 8 carbon atoms, other than the aliphatic unsaturated group, $Rf^1$ represents a $CF_3$—$(CF_2)_y$—$(CH_2)_z$— group ("y" and "z" have the same meanings as before, "a" represents an integer of 1 to 3, and "e", "f", and "g" represent integers of e≥0, f≥1, and g≥0, respectively.

In the general formula (2), it is preferable that the aliphatic unsaturated group of $R^{11}$ be an alkenyl group or an alkynyl group, preferably an alkenyl group or alkynyl group having 2 to 10 and particularly 2 to 6 carbon atoms such as a vinyl group, an allyl group, and an ethynyl group, and particularly preferably a vinyl group.

Examples of the substituted or unsubstituted monovalent hydrocarbon having 1 to 8 carbon atoms, other than the aliphatic unsaturated group, of $R^{12}$ include an alkyl group such as a methyl group, an ethyl group, a propyl group, and a butyl group, a cycloalkyl group such as a cyclohexyl group and a cyclopentyl group, an aryl group such as a phenyl group, a tolyl group, and a xylyl group, an aralkyl group such as a benzyl group and a phenylethyl group, and a halogenated hydrocarbon group such as a chloromethyl group, a chloropropyl group, and a chlorocyclohexyl group. An unsubstituted monovalent hydrocarbon group having 1 to 6 carbon atoms is preferred, and a methyl group is particularly preferred.

$Rf^1$ is defined as $CF_3$—$(CF_2)_y$—$(CH_2)_z$—, wherein "y" and "z" have the same meanings as before, "y" is preferably an integer that satisfies 0≤y≤9, and "z" is preferably an integer that satisfies 1≤z≤10. In a case where there is a plurality of $Rf^1$s (in a case where "f" in the general formula (2) is 2 or more), each of $Rf^1$s may be the same group(s) or different groups.

In the present invention, $CF_3$—$(CH_2)_2$—, $CF_3$—$(CF_2)_3$—$(CH_2)_2$—, and $CF_3$—$(CF_2)_5$—$(CH_2)_2$— groups are particularly preferred from the viewpoint of synthesis.

In the general formula (2), "e" represents an integer of 0 or more, and preferably 0 to 50. "f" represents an integer of 1 or more, preferably 20 to 5,000, and more preferably 5 to 1,000. "g" represents an integer of 0 or more, preferably 0 to 10,000, and more preferably 0 to 5,000. "e+f+g" is preferably 5 to 10,000, more preferably 10 to 3,000, and particularly preferably 20 to 500. "f/(e+f+g)" is preferably within a range of 1/50 to 1/1, more preferably 1/10 to 1/1, and particularly preferably 1/5 to 1/1.

It is suitable that the organopolysiloxane of the component (A) have a viscosity of 100 to 10,000,000 mPa·s, and particularly 200 to 500,000 mPa·s at 25° C. The organopolysiloxane may be used alone or in a combination of two or more kinds thereof. Incidentally, the viscosity is measured with a rotation viscometer.

The organopolysiloxane of the component (A) can be produced through a known method. For example, a cyclotrisiloxane represented by the following general formula (i), a cyclotrisiloxane represented by the following general formula (ii), an organosiloxane represented by the following general formula (iii), and if necessary, a cyclotrisiloxane represented by the following general formula (iv) are copolymerized in the presence of an alkali or acid catalyst to obtain the organopolysiloxane,

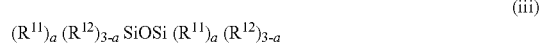

wherein, $R^{11}$, $R^{12}$, $Rf^1$, and "a" have the same meanings as before.

<Component (B)>

The component (B) is an organopolysiloxane having two or more silicon atom-bonded aliphatic unsaturated groups and one or more silicon atom-bonded $CF_3$—$(CF_2)_y$—$(CH_2)_z$— groups in one molecule, and having either or both of siloxane units represented by $SiO_{4/2}$ and $RSiO_{3/2}$ as a branched structure, wherein "y" represents an integer of 0 or more, "z" represents an integer of 1 or more, and R represents a substituted or unsubstituted monovalent hydrocarbon group and is exemplified by the above-mentioned $R^{11}$ and $R^{12}$. In a case where there is a plurality of siloxane units having R, each of Rs may be the same group(s) or different groups.

Examples of the silicon atom-bonded aliphatic unsaturated group include those exemplified as the component (A).

The organopolysiloxane of the component (B) has a branched structure, and necessarily has a branched structure of $SiO_{4/2}$ unit and/or $RSiO_{3/2}$ unit. Further, the organopolysiloxane may contain a $R_2SiO_{2/2}$ unit such as a methylvinylsiloxy unit and a dimethylsiloxy, or a $R_3SiO_{1/2}$ unit such as a dimethylvinylsiloxy unit and a trimethylsiloxy unit, wherein R has the same meanings as before.

The content of the SiO$_{4/2}$ unit and/or the RSiO$_{3/2}$ unit is preferably 5 mol % or more, more preferably 10 to 95 mol %, and particularly preferably 25 to 80 mol %, relative to the total siloxane unit in the organopolysiloxane of the component (B).

It is suitable that the organopolysiloxane have a weight average molecular weight of 500 to 100,000 from the viewpoint of isolation.

The component (B) can be synthesized through a known method. For example, compounds that are each a unit source are combined so that production units are at a predetermined ratio, and (co)hydrolyzed in the presence of an acid, resulting in synthesis with ease.

When the organopolysiloxane having a branched structure of the component (B) is used in combination, the cured product to be obtained has excellent hardness and mechanical strength.

The blending amount of the component (B) is 1 to 100 parts by mass, and preferably 2 to 50 parts by mass, relative to 100 parts by mass of the component (A). When the blending amount of the component (B) is less than 1 part by mass, the hardness and strength of the cured product are insufficient. When it is more than 100 parts by mass, the cured product is fragile, and the encapsulating performance deteriorates.

<Component (C)>

The component (C) is an organosilicon compound represented by the following general formula (1), and acts as a cross-linker that is subjected to a hydrosilylation reaction with the components (A) and (B). The component (C) is a SiH group-containing organosilicon compound (organohydrogen polysiloxane) modified by fluorine for lowering the refractive index of the cured product and improving compatibility with the components (A) and (B), transparency, and cross-linking reaction ratio, and the component (C) preferably have no aliphatic unsaturated group. Moreover, since the component (C) has a D unit and thereby is highly polymerized, the component (C) is not volatilized even at high temperature during production of an optical device, and the reliability of a product can be more improved. It is preferable that the component (C) have a branched structure. The component (C) may be used alone or in a combination of two or more kinds thereof,

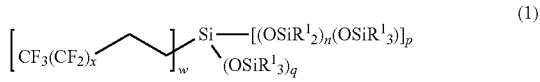

(1)

wherein R$^1$ represents a hydrogen atom or the same or different substituted or unsubstituted monovalent organic group having 1 to 10 carbon atoms, "x" represents an integer of 0 or more, "w", "p", and "q" satisfy 1≤w≤2, 0<p≤3, 0≤q<3, 2≤p+q≤3, and w+p+q=4, "n" represents an integer of 1 or more, and two or more of R$^1$s are hydrogen atoms.

In the general formula (1), R$^1$ represents a hydrogen atom or the same or different substituted or unsubstituted monovalent organic group having 1 to 10 carbon atoms, and preferably 1 to 8 carbon atoms.

Two or more of R$^1$s are hydrogen atoms, and the silicon atom-bonded hydrogen atom (SiH group) is subjected to a hydrosilylation reaction with the silicon atom-bonded aliphatic unsaturated group in the components (A) and (B) to cure the composition.

It is preferable that the organic group be a hydrocarbon group, and examples of the hydrocarbon group include an alkyl group having 1 to 10 carbon atoms, preferably 1 to 8 carbon atoms, and more preferably 1 to 6 carbon atoms such as a methyl group, an ethyl group, a propyl group, an isopropyl group, a butyl group, an isobutyl group, a sec-butyl group, a tert-butyl group, a pentyl group, a isopentyl group, a neopentyl group, a hexyl group, a heptyl group, a 1-ethylpentyl group, an octyl group, a 2-ethylhexyl group, a nonyl group, and a decyl group; a cycloalkyl group having 3 to 10 carbon atoms, preferably 4 to 7 carbon atoms, and more preferably 5 to 6 carbon atoms such as a cyclopropyl group, a cyclobutyl group, a cyclopentyl group, a cyclohexyl group, a cycloheptyl group, a cyclooctyl group, a cyclononyl group, and a cyclodecyl group; an aryl group having 6 to 10 carbon atoms, preferably 6 to 9 carbon atoms, and more preferably 6 to 8 carbon atoms such as a phenyl group, a tolyl group, a xylyl group, a trimethylphenyl group, and a naphthyl group; an aralkyl group having 7 to 10 carbon atoms, preferably 7 to 9 carbon atoms, and more preferably 7 to 8 carbon atoms such as a benzyl group, a phenylethyl group, a phenylpropyl group, and a phenylbutyl group; and a group in which a part of or all of hydrogen atoms bonded to carbon atoms in these hydrocarbon groups are substituted with a halogen atom (e.g., fluorine atom, chlorine atom, bromine atom, or iodine atom), a cyano group, an epoxy group-containing group (e.g., epoxy group, glycidyl group, or glycidoxy group), or an alkoxy group (e.g., methoxy group, ethoxy group, propoxy group, or butoxy group), such as a chloromethyl group, a bromoethyl group, a 3,3,3-trifluoropropyl group, a 3,3,4,4,5,5,6,6,7,7,8,8,8-tridecafluorooctyl group, a 2-(nonafluorobutyl)ethyl group, and a p-chlorophenyl group.

Among them, from the viewpoints of easy synthesis of organosilicon compounds of the present invention and compatibility with the components (A) and (B), a methyl group, an ethyl group, a propyl group, a 3,3,3-trifluoropropyl group, a 2-(nonafluorobutyl)ethyl group, and a 3,3,4,4,5,5,6,6,7,7,8,8,8-tridecafluorooctyl group are preferred, and a methyl group, an ethyl group, and a 3,3,3-trifluoropropyl group are particularly preferred.

When the hydrocarbon group has an epoxy group-containing group and/or an alkoxy group as a substituent, the adhesion can be imparted to the cured product of the addition-curable silicone composition of the present invention.

In the general formula (1), "x" represents an integer of 0 or more, and preferably 0 to 9.

It is preferable that "w", "p", and "q" satisfy 1≤w≤2, 0<p≤3, 0≤q<3, 2≤p+q≤3, and w+p+q=4, and the compound have a branched structure wherein w=1 and p+q=3.

"n" represents an integer of 1 or more, and preferably 1 or 2.

Specific examples of the organosilicon compound represented by the general formula (1) include the following compounds, but the organosilicon compound is not limited to these.

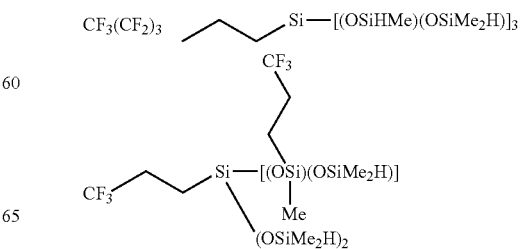

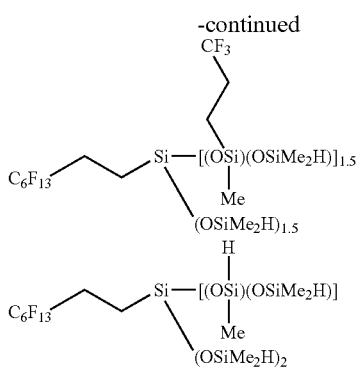

The component (C) can be synthesized through a known method. For example, compounds that are each a unit source are combined so that production units are at a predetermined ratio, and (co)hydrolyzed in the presence of an acid, resulting in synthesis with ease.

The resulting organosilicon compound can be purified through a known method such as water washing, distillation, and concentration.

The blending amount of the component (C) is such an amount that the molar ratio of the SiH group in the component (C) to the aliphatic unsaturated group in the components (A) and (B) satisfies 0.2≤SiH group/aliphatic unsaturated group≤5.0, and preferably 0.5≤SiH group/aliphatic unsaturated group≤2.0. When the molar ratio of the SiH group to the aliphatic unsaturated group is less than 0.2 or more than 5.0, the curability of the composition is deteriorated.

<Component (D)>

The component (D) is a platinum group metal-based catalyst that promotes a hydrosilylation addition reaction of the components (A) and (B) with the component (C).

Any catalyst may be used as a platinum group metal-based catalyst of the component (D) as long as it promotes a hydrosilylation addition reaction of the silicon atom-bonded aliphatic unsaturated group in the components (A) and (B) with the SiH group in the component (C). The compound (D) may be used alone or in a combination of two or more kinds thereof.

Examples of the component (D) include platinum group metal such as platinum, palladium, and rhodium, chloroplatinic acid, alcohol-modified chloroplatinic acid, a coordination compound of chloroplatinic acid with olefins, vinylsiloxane, or an acetylene compound, and a platinum group metal compound such as tetrakis(triphenylphosphine) palladium and chlorotris(triphenylphosphine) rhodium. A platinum compound is particularly preferred.

The blending amount of the component (D) is an effective amount as a hydrosilylation catalyst. The amount in terms of mass of platinum group metal element is preferably within a range of 0.1 to 1,000 ppm, and more preferably 1 to 500 ppm, relative to the total amount of the components (A), (B), and (C).

<Other Components>

In addition to the above-mentioned components (A) to (D), the addition-curable silicone composition of the present invention may contain other optional components. Specific examples thereof include the following components. The other components may be each used alone or in a combination of two or more kinds thereof.

<<Aliphatic Unsaturated Group-Containing Compound Other than the Components (A) and (B)>>

In addition to the components (A) and (B), the addition-curable silicone composition of the present invention may contain an aliphatic unsaturated group-containing compound that is subjected to an addition reaction with the component (C). Such an aliphatic unsaturated group-containing compound other than the components (A) and (B) is preferably a compound involved in the formation of the cured product. Therefore, a compound having two or more aliphatic unsaturated groups in one molecule is preferred. Examples of a molecular structure of such an organopolysiloxane other than the components (A) and (B) include a cyclic structure.

Specific examples of the aliphatic unsaturated group-containing compound other than the components (A) and (B) include a monomer such as butadiene and diacrylate derived from polyfunctional alcohol; polyolefin such as copolymer of polyethylene, polypropylene, or a styrene and other ethylenically unsaturated compound (e.g., acrylonitrile or butadiene); and an oligomer or a polymer derived from a functionally substituted organic compound such as an ester of acrylic acid, methacrylic acid, or maleic acid. The aliphatic unsaturated group-containing compound other than the components (A) and (B) may be liquid or solid at room temperature.

<<Addition Reaction Controlling Agent>>

In order to obtain a desired pot life, an addition reaction controlling agent may be blended into the addition-curable silicone composition of the present invention. The addition reaction controlling agent is not particularly limited as long as it is a compound having an effect of suppressing curing against a hydrosilylation catalyst of the component (D), and a known addition reaction controlling agent can be used. Specific examples thereof include a phosphorous-containing compound such as triphenylphosphine; a nitrogen-containing compound such as tributylamine, tetramethylethylenediamine, and benzotriazole; a sulfur-containing compound; an acetylenic compound such as acetylene alcohols (e.g., 1-ethynylcyclohexanol and 3,5-dimethyl-1-hexyn-3-ol); a compound having two or more alkenyl groups; a hydroperoxy compound; and a derivative of maleic acid.

The degree of the effect of suppressing curing by the addition reaction controlling agent depends on a chemical structure of the addition reaction controlling agent. Therefore, it is preferable that the adding amount of each of addition reaction controlling agents be adjusted to an optimum amount. When an optimum amount of addition reaction controlling agent is added, the composition has excellent long-time storage stability at room temperature and heat curability.

<<Other Optional Components>>

In order to suppress occurring such as coloring, clouding, and oxidation deterioration of the cured product, the addition-curable silicone composition of the present invention may contain a known antioxidant such as 2,6-di-tert-butyl-4-methylphenol. In order to impart resistance to photodegradation, a light stabilizer such as a hindered amine-based stabilizer may be blended. Moreover, if necessary, in order to enhance the strength, inorganic filler such as fumed silica may be blended, and a dye, a pigment, a flame retarder, or the like, may also be blended.

[Cured Product]

The addition-curable silicone composition of the present invention can be cured under a known curing condition through a known curing method. Specifically, the composition can be cured by heating usually at room temperature to 200° C., and preferably 80 to 160° C. The heating time may be about 0.5 minutes to about 5 hours, and particularly about 1 minute to about 3 hours. In a case where a higher precision is required for LED encapsulating or the like, the curing time is preferably elongated. The form of the cured product is not particularly limited, and may be any of a gel cured product, an elastomer cured product, and a resin cured product, for example.

In a case where the cured product of the addition-curable silicone composition of the present invention is used for encapsulating an optical device, it is preferable that the cured product be colorless and transparent and have low refractive index (usually about 1.41 or less), and a transmittance of light with a wavelength of 300 to 800 nm at 25° C. of 80% or more in a 2 mm thick layer.

In order to improve the performance of an optical device such as LED to be desired, and particularly the transmittance of light with a wavelength of 400 nm at 25° C., the refractive index (25° C.) of the cured product with a visible light (589 nm) is preferably 1.40 or less, and particularly preferably 1.30 to 1.39.

In order to satisfy such performance, it is preferable that addition of any component that lowers the transmittance of light and the like be eliminated as much as possible.

It is preferable that the cured product of the addition-curable silicone composition of the present invention have rubber properties and strength properties that are suitable for use as an encapsulant, and specifically have a hardness (Type A) of 20 to 90, a breaking elongation of 10 to 100%, and a tensile strength of 0.1 to 5.0 MPa in accordance with JIS-K 6249.

As described above, the cured product obtained by curing the addition-curable silicone composition of the present invention is in a state of elastomer, gel, flexible rubber, or elastic resin. The cured product has high transparency, low refractive index, excellent light extraction efficiency, good rubber properties and strength properties, and no tack after curing, since components therein are not volatilized during a process of producing a device. The cured product of the addition-curable silicone composition of the present invention has excellent heat resistance, cold resistance, and electrical insulation, similar to an ordinary cured product of an addition-curable silicone composition.

Since the cured product has excellent transmittance of light with a wavelength of 400 nm at 25° C. desired as the optical device performance, the composition can be particularly suitably used for an encapsulant for an optical device such as LED. Specifically, when the addition-curable silicone composition of the present invention is used as an encapsulant for an optical device, light emitted from the optical device is prevented from being totally reflected on a surface of the cured product having high transparency and low refractive index. Therefore, the brightness of LED can be particularly improved.

[Optical Device]

The present invention provides an encapsulated optical device obtained by applying the addition-curable silicone composition of the present invention to, for example, LED, a semiconductor laser, a photodiode, a phototransistor, a solar battery, CCD, or the like, and curing the applied composition through a known curing method under a known curing condition, specifically as described above.

The optical device of the present invention is particularly excellent in reliability since it is encapsulated with the above-mentioned cured product of the addition-curable silicone composition of the present invention.

EXAMPLES

Hereinafter, the present invention will be specifically described with reference to Examples and Comparative Examples, but the present invention is not limited to these Examples.

In the following examples, the viscosity was measured by a rotation viscometer at 23° C.

The refractive index was measured with a wavelength of 589 nm at 25° C. by using a digital refractometer RX-5000 manufactured by ATAGO Co., Ltd., and the hardness, the breaking elongation, and the tensile strength were measured by No. 2 dumbbell in accordance with JIS-K 6249.

The transmittance of light was obtained by molding a composition in a 2 mm thick sheet shape, curing the composition, and measuring the transmittance of light with a wavelength of 400 nm at 25° C. with a spectrophotometer.

In the following examples, symbols in an average composition formula each represent the following units.

Further, the amount by mole of each of organopolysiloxane having a linear or branched structure and organohydrogen polysiloxane represents the average amount by mole of a vinyl group or a SiH group in each component.

M: $(CH_3)_3SiO_{1/2}$
$M^{V1}$: $(CH_2=CH)(CH_3)_2SiO_{1/2}$
$M^H$: $H(CH_3)_2SiO_{1/2}$
D: $(CH_3)_2SiO_{2/2}$
$D^{V1}$: $(CH_2=CH)(CH_3)SiO_{2/2}$
$D^H$: $H(CH_3)SiO_{2/2}$
$D^{F1}$: $(CF_3-CH_2-CH_2)(CH_3)SiO_{2/2}$
$D^{F9}$: $[CF_3-(CF_2)_3-(CH_2)_2](CH_3)SiO_{2/2}$
$D^{F13}$: $[CF_3-(CF_2)_5-(CH_2)_2](CH_3)SiO_{2/2}$
T: $(CH_3)SiO_{3/2}$
$T^{F1}$: $(CF_3-CH_2-CH_2)SiO_{3/2}$
$TF^{13}$: $[CF_3-(CF_2)_5-(CH_2)_2]SiO_{3/2}$

Synthesis Example 1

In a 500-mL four-necked flask equipped with a stirrer, a condenser, a dropping funnel, and a thermometer, 71.9 g (0.33 mol) of 3,3,3-trifluoropropyltrimethoxy silane, 25.5 g (0.05 mol) of 1,3,5-tris[(3,3,3-trifluoropropyl)methyl]cyclotrisiloxane, and 67.0 g (0.5 mol) of tetramethyldihydrodisiloxane were placed, and cooled to 5 to 15° C.

To the mixture, 8.2 g (0.08 mol) of sulfuric acid was added and mixed well, and then 18.7 g (1.05 mol) of ion-exchange water was added dropwise. After completion of dropwise addition, the mixture was stirred at room temperature for 8 hours. After completion of stirring, the solution was settled for 15 minutes, and a supernatant was removed. 300 mL of water was further added, the mixture was stirred for 15 minutes and settled for 15 minutes, and a supernatant was removed. This operation was repeated three times to remove an acid remained in a product. To this solution, 3 g (0.02 mol) of sodium sulfate decahydrate was added and filtered to remove contained water.

The filtrate was concentrated under conditions of 100° C./8 mmHg for 1 hour, and filtered through NA-500 manufactured by ADVANTEC, to obtain 67.4 g of targeted organohydrogen polysiloxane represented by an average composition formula of $T^{F1}D^{F1}M^H_3$ (yield: 41%). The structure thereof is shown below.

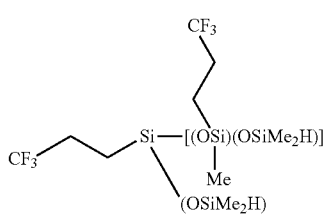

The compound was identified from an amount of hydrogen gas generated of 136 mL/g (theoretical amount: 133 mL/g).

Synthesis Example 2

In a 500-mL four-necked flask equipped with a stirrer, a condenser, a dropping funnel, and a thermometer, 240.8 g (0.5 mol) of (3,3,4,4,5,5,6,6,7,7,8,8,8-tridecafluorooctyl)trichlorosilane, 33.8 g (0.08 mol) of 1,3,5-tris[(3,3,3-trifluoropropyl)methyl]cyclotrisiloxane, and 110.6 g (0.825 mol) of tetramethyldihydrodisiloxane were placed, and cooled to 5 to 15° C.

To the mixture, 18.9 g (0.19 mol) of sulfuric acid was added and mixed well, and then 29.7 g (1.65 mol) of ion-exchange water was added dropwise. After completion of dropwise addition, the mixture was stirred at room temperature for 8 hours. After completion of stirring, the solution was settled for 15 minutes, and a supernatant was removed. 300 mL of water was further added, the mixture was stirred for 15 minutes and settled for 15 minutes, and a supernatant was removed. This operation was repeated to remove an acid remained in a product. To this solution, 3 g (0.02 mol) of sodium sulfate decahydrate was added and filtered to remove contained water.

The filtrate was concentrated under conditions of 130° C./8 mmHg for 1 hour, and filtered through NA-500, to obtain 80.1 g of targeted organohydrogen polysiloxane represented by an average composition formula of $T^{F13}D^{F1}{}_{1.5}M^{H}{}_{3}$ (yield: 20.8%). The structure thereof is shown below.

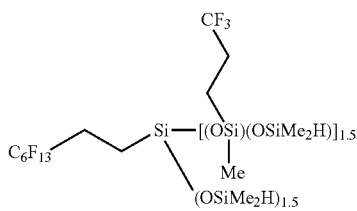

The compound was identified from an amount of hydrogen gas generated of 83.7 mL/g (theoretical amount: 84.8 mL/g).

Synthesis Example 3

In a 500-mL four-necked flask equipped with a stirrer, a condenser, a dropping funnel, and a thermometer, 120.0 g (0.2 mol) of 3,3,4,4,5,5,6,6,7,7,8,8,8-tridecafluorooctyl-tris(dimethylsiloxy) silane was placed, and cooled to 5 to 15° C. To this compound, 0.16 g (0.0011 mol) of trifluoromethane sulfonic acid was added, and then 36.0 g (0.15 mol) of tetramethylcyclotetrasiloxane was added dropwise. After completion of dropwise addition, the mixture was stirred at room temperature for 8 hours. After completion of stirring, 0.96 g of KYOWAAD 500SH (available from Kyowa Chemical Industry Co., Ltd.) was added, and the mixture was stirred at room temperature for 2 hours and filtered through NA-500 to remove an acid.

The filtrate was concentrated under conditions of 120° C./8 mmHg for 1 hour, and filtered through NA-500, to obtain 113.0 g of targeted organohydrogen polysiloxane represented by an average composition formula of $T^{F13}D^{H}M^{H}{}_{3}$ (yield: 72.4%). The structure thereof is shown below.

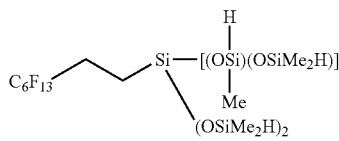

The compound was identified from an amount of hydrogen gas generated of 130 mL/g (theoretical amount: 136 mL/g).

Synthesis Example 4

In a 500-mL four-necked flask equipped with a stirrer, a coiled condenser, a dropping funnel, and a thermometer, 66.3 g (0.50 mol) of 1,1,3,3-tetramethyldisiloxane, 13.4 g of concentrated hydrochloric acid, and 9.8 g of water were placed, and the temperature was adjusted to 10 to 15° C. under stirring using a water bath. After adjustment of the temperature, 64.9 g (0.30 mol) of 3,3,3-trifluoropropyl trimethoxy silane was added dropwise so that the temperature was adjusted to 15° C. or lower. After completion of dropwise addition, the mixture was stirred at 10 to 15° C. for 1 hour, waste acid was separated, and water washing was repeated until the mixture was neutralized. The resultant was distilled under reduced pressure (main fraction: 58 to 63° C./8 mmHg) to obtain 82.9 g of targeted 3,3,3-trifluoropropyl-tris(dimethylsiloxy) silane (yield: 79%).

The compound was identified from an amount of hydrogen gas generated of 200 mL/g (theoretical amount: 192 mL/g).

Example 1

A mixture of (A) 75.0 g (0.017 mol) of linear organopolysiloxane represented by an average composition formula of $M^{Vi}{}_{2}D^{F1}{}_{27.3}$, (B) 25.0 g (0.017 mol) of organopolysiloxane having a branched structure represented by an average composition formula of $D^{Vi}{}_{1.5}D^{F9}{}_{0.5}T^{F1}{}_{8}$, and (C) 15.5 g (0.03 mol) of organohydrogen polysiloxane represented by an average composition formula of $T^{F1}D^{F1}M^{H}{}_{3}$ that was synthesized in Synthesis Example 1, and (D) 0.15 g of catalyst were mixed to obtain a silicone composition. The composition was heated at 150° C. for 2 hours to be cured, and the physical properties of the resulting elastomer were measured. The results of measurements are shown in Table 1.

Example 2

A mixture of (A) 50.0 g (0.016 mol) of linear organopolysiloxane represented by an average composition formula of $M^{Vi}{}_{2}D^{F13}{}_{4}D^{F1}{}_{12}$, (B) 50.0 g (0.014 mol) of organopolysiloxane having a branched structure represented by an average composition formula of $D^{Vi}{}_{2}T_{9}T^{F13}{}_{6}$, and (C) 15.8 g (0.019 mol) of organohydrogen polysiloxane represented by an average composition formula of $T^{F13}D^{F1}{}_{1.5}M^H{}_3$ that was synthesized in Synthesis Example 2, and (D) 0.15 g of catalyst were mixed to obtain a silicone composition. The composition was heated at 150° C. for 2 hours to be cured, and the physical properties of the resulting elastomer were measured. The results of measurements are shown in Table 1.

Example 3

A silicone composition was obtained by the same operation as in Example 2 except that 10.1 g (0.015 mol) of organohydrogen polysiloxane represented by an average composition formula of $TF^{13}D^HM^H{}_3$ that was synthesized in Synthesis Example 3 was used as the component (C) in Example 2. The composition was heated at 150° C. for 2 hours to be cured, and the physical properties of the resulting elastomer were measured. The results of measurements are shown in Table 1.

Comparative Example 1

A silicone composition was obtained by the same operation as in Example 1 except that 9.63 g (0.027 mol) of organohydrogen polysiloxane represented by the following formula (v) was used instead of the component (C) in Example 1. The composition was heated at 150° C. for 2 hours to be cured, and the physical properties of the resulting elastomer were measured. The results of measurements are shown in Table 1.

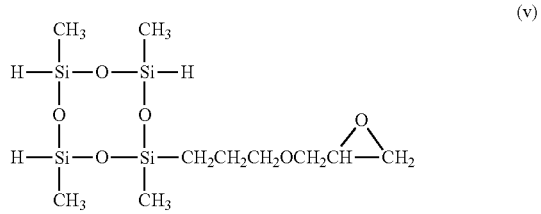
(v)

Comparative Example 2

A silicone composition was obtained by the same operation as in Example 1 except that 25.9 g (0.019 mol) of organohydrogen polysiloxane represented by an average composition formula of $M_2D^H{}_4D^{F1}{}_6$ that was prepared by acid balance was used instead of the component (C) in Example 1. The composition was heated at 150° C. for 2 hours to be cured, and the physical properties of the resulting elastomer were measured. The results of measurements are shown in Table 1.

Comparative Example 3

A silicone composition was obtained by the same operation as in Example 1 except that 100.0 g (0.019 mol) of linear organopolysiloxane represented by an average composition formula of $M^{Vi}{}_2D_{146}$ was used instead of the component (A) in Example 1, the component (B) in Example 1 was not used, and 0.075 g of ethynylcyclohexanol was used as an addition reaction controlling agent. The composition was heated at 150° C. for 2 hours to be cured, and the physical properties of the resulting elastomer were measured. The results of measurements are shown in Table 1.

Comparative Example 4

A silicone composition was obtained by the same operation as in Example 1 except that 9.5 g (0.027 mol) of 3,3,3-trifluoropropyl-tris(dimethylsiloxy) silane that was synthesized in Synthesis Example 4 was used instead of the component (C) in Example 1. The composition was heated at 150° C. for 2 hours to be cured, and the physical properties of the resulting elastomer were measured. The results of measurements are shown in Table 1.

TABLE 1

|  | Example 1 | Example 2 | Example 3 | Comparative Example 1 | Comparative Example 2 | Comparative Example 3 | Comparative Example 4 |
| --- | --- | --- | --- | --- | --- | --- | --- |
| Appearance | Colorless and transparent | Colorless and transparent | Colorless and transparent | Colorless and transparent | Colorless and transparent | Clouded | Colorless and transparent |
| Refractive index ($n_D{}^{25}$) | 1.38 | 1.35 | 1.35 | 1.41 | 1.38 | 1.41 | 1.38 |
| Hardness (Type A) | 62 | 55 | 75 | 65 | 67 | 33 | 65 |
| Breaking elongation (%) | 60 | 70 | 50 | 60 | 20 | 30 | 70 |
| Tensile strength (MPa) | 2.0 | 1.8 | 2.4 | 2.1 | 1.6 | 0.3 | 2.1 |
| transmittance of 400-nm light (%) | 93.0 | 92.6 | 92.5 | 88.0 | 92.1 | 78.1 | 93.3 |
| tack on surface after curing | none | none | none | none | none | none | present |

As shown in Table 1, in Examples 1, 2, and 3 using organohydrogen polysiloxane as the component (C) of the present invention, the compatibility of the component (C) with the components (A) and (B) is good, and the resulting cured products have high transparency and transmittance of light. Additionally, the hardness, the breaking elongation, and the tensile strength of the cured products are high; that is the strength properties as elastomer are good. Further, in Examples 1, 2, and 3, components therein are not volatilized during curing, and no tack on the surface after curing is generated. This shows that product reliability thereof is excellent.

On the other hand, in Comparative Example 1, since the organohydrogen polysiloxane does not contain fluorine, the compatibility of the organohydrogen polysiloxane with the components (A) and (B) is poor, the refractive index of the resulting cured product increases, and the transmittance of light is deteriorated as compared with Examples. In Comparative Example 2, since the organohydrogen polysiloxane contains fluorine, the compatibility is high. However, since the organohydrogen polysiloxane does not have a structure in which a silicon atom only bonded to a fluorine-substituted hydrocarbon group and a siloxane chain, the machine characteristics of the composition are not excellent. In Comparative Example 3, since the linear organopolysiloxane does not contain fluorine and the branched organopolysiloxane is not used, the compatibility of the linear organopolysiloxane with the component (C) is poor and transmittance of light and machine characteristics largely deteriorate. In Comparative Example 4, since the organohydrogen polysiloxane does not contain a D unit, the organohydrogen polysiloxane is volatilized and tack on the surface after curing is generated. This shows that product reliability thereof is low.

Thus, the addition-curable silicone composition of the present invention can be an addition-curable silicone composition that provides a cured product having low refractive index, high transparency, excellent light extraction efficiency, good rubber properties and strength properties, and no tack after curing, and in particular, has good transmittance of light with a wavelength of 400 nm at 25° C.

It must be stated here that the present invention is not restricted to the embodiments shown above. The embodiments shown above are merely examples so that any embodiments composed of substantially the same technical concept as disclosed in the claims of the present invention and expressing a similar effect are included in the technical scope of the present invention.

What is claimed is:

1. An addition-curable silicone composition comprising:
   (A) a linear organopolysiloxane having two or more silicon atom-bonded aliphatic unsaturated groups and one or more silicon atom-bonded $CF_3$—$(CF_2)_y$—$(CH_2)_z$— groups in one molecule ("y" represents an integer of 0 or more and "z" represents an integer of 1 or more), wherein the amount is 100 parts by mass;
   (B) an organopolysiloxane having two or more silicon atom-bonded aliphatic unsaturated groups and one or more silicon atom-bonded $CF_3$—$(CF_2)_y$—$(CH_2)_z$— groups in one molecule, and having either or both of siloxane units represented by $SiO_{4/2}$ and $RSiO_{3/2}$ as a branched structure ("y" represents an integer of 0 or more, "z" represents an integer of 1 or more, and R represents a substituted or unsubstituted monovalent hydrocarbon group), wherein the amount is 1 to 100 parts by mass;
   (C) an organosilicon compound represented by the following general formula (1), wherein the amount is such an amount that the molar ratio of the SiH group in the component (C) to the total aliphatic unsaturated group in the components (A) and (B) satisfies 0.2≤SiH group/aliphatic unsaturated group≤5.0,

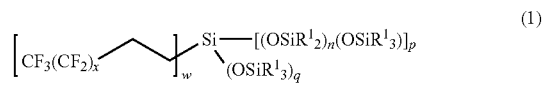

(1)

wherein $R^1$ represents a hydrogen atom or the same or different substituted or unsubstituted monovalent organic group having 1 to 10 carbon atoms, "x" represents an integer of 0 or more, "w", "p", and "q" satisfy 1≤w≤2, 0<p≤3, 0≤q<3, 2≤p+q≤3, and w+p+q=4, "n" represents an integer of 1 or more, and two or more of $R^1$s are hydrogen atoms; and
   (D) a platinum group metal-based catalyst, wherein the amount is an effective amount.

2. The addition-curable silicone composition according to claim 1, wherein the addition-curable silicone composition provides a cured product having a transmittance of light with a wavelength of 300 to 800 nm at 25° C. of 80% or more in a 2 mm thick layer by curing.

3. The addition-curable silicone composition according to claim 1, wherein the addition-curable silicone composition provides a cured product having a refractive index (25° C.) with a visible light (589 nm) of 1.40 or less by curing.

4. The addition-curable silicone composition according to claim 2, wherein the addition-curable silicone composition provides a cured product having a refractive index (25° C.) with a visible light (589 nm) of 1.40 or less by curing.

5. An optical device encapsulated with a cured product of the addition-curable silicone composition according to claim 1.

6. An optical device encapsulated with a cured product of the addition-curable silicone composition according to claim 2.

7. An optical device encapsulated with a cured product of the addition-curable silicone composition according to claim 3.

8. An optical device encapsulated with a cured product of the addition-curable silicone composition according to claim 4.

* * * * *